US008890593B1

United States Patent
Kim et al.

(10) Patent No.: US 8,890,593 B1
(45) Date of Patent: Nov. 18, 2014

(54) DELAY-LOCKED LOOP (DLL) OPERATION MODE CONTROLLER CIRCUIT AND METHOD FOR CONTROLLING THEREOF

(71) Applicant: MagnaChip Semiconductor, Ltd., Cheongju-si (KR)

(72) Inventors: Jung Hyun Kim, Cheongju-si (KR); Brian Chung, Cheongju-si (KR); Steve Kang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/206,409

(22) Filed: Mar. 12, 2014

(30) Foreign Application Priority Data

May 22, 2013 (KR) .................. 10-2013-0058004

(51) Int. Cl.
*H03L 7/06* (2006.01)
*H03L 7/08* (2006.01)
(52) U.S. Cl.
CPC ........................................ *H03L 7/08* (2013.01)
USPC .......................................... 327/158; 327/149

(58) Field of Classification Search
None
See application file for complete search history.

(56) References Cited

U.S. PATENT DOCUMENTS

| 6,101,137 | A  | * | 8/2000  | Roh .............................. 365/194 |
| 7,486,119 | B2 | * | 2/2009  | Lee ............................... 327/158 |
| 7,675,334 | B2 | * | 3/2010  | Kawamoto ..................... 327/158 |
| 7,728,638 | B2 | * | 6/2010  | Varricchione .................. 327/158 |
| 2007/0013420 | A1 | * | 1/2007  | Jin ................................ 327/158 |
| 2008/0272812 | A1 | * | 11/2008 | Cho .............................. 327/158 |

* cited by examiner

*Primary Examiner* — Cassandra Cox
(74) *Attorney, Agent, or Firm* — NSIP Law (57) ABSTRACT

A delay-locked loop (DLL) operation mode control circuit and corresponding method are provided in which one of the output values from a display driver IC (DDI) is detected to switch a DLL block to standby mode. In examples, a CLKP/N frequency and CLKP/N common terminal voltage status are used to switch mode. Accordingly, since inoperable frequency domains otherwise present in a normal mode interval of the DLL block is included into standby mode, more stable operation of the DLL circuit is provided.

16 Claims, 7 Drawing Sheets

DELAY-LOCKED LOOP (DLL) OPERATION MODE CONTROLLER CIRCUIT AND METHOD FOR CONTROLLING THEREOF

CROSS-REFERENCE TO RELATED APPLICATIONS

This application claims the benefit under 35 U.S.C. §119 (a) of Korean Patent Application No. 10-2013-0058004 filed on May 22, 2013, in the Korean Intellectual Property Office, the entire disclosure of which is incorporated herein by reference for all purposes.

BACKGROUND

1. Field

The following description relates to delay-locked loop (DLL) operation mode control. Additionally, the following description relates to a DLL operation mode control circuit configured to determine a mode of a DLL circuit block chosen from standby mode and normal operation mode, according to clock frequency or operational status of a display driver IC (DDI), and a corresponding method.

2. Description of Related Art

Increasing clock frequency is a technique that is utilized to further improve operation speed of semiconductor-based integrated circuits (ICs). However, increasing clock frequency increases power consumption for the IC because it is necessary to drive a delay-locked loop (DLL) circuit to change the clock frequency. Driving a DLL circuit uses additional power, which increases power consumption for the IC as a whole. Hence, research is being actively conducted to find ways to reduce power consumption by the DLL circuits, to allow increased clock frequency while minimizing power consumption.

The preceding issues are involved with the increased use of miniaturized display products which use a display driver IC (DDI) with lower power consumption. That is, since DDI technology is often implemented in mobile products such as mobile phones or portable media players (PMPs), lower power consumption is closely related to increasing use time of the mobile devices. Such mobile devices generally operate as portable devices by using batteries that store a finite amount of energy. Hence, if less power is consumed by the device, the energy in the battery is depleted more slowly and the device is able to function for a longer period of time. Additionally, reducing power consumption is generally desirable due to the cost of replacement batteries and/or the cost of electrical power. Due to these considerations, continuous efforts are underway to reduce power consumption for employing a DDI for panel use, such as in a liquid crystal display (LCD) screen, a plasma display panel (PDP), a TV or a laptop computer.

One way to reduce power consumption at a DDI is to control the driving status of the DLL circuit. That is, it is possible to reduce power consumption by the DLL circuit driving the DDI, by causing the DLL circuit to switch between normal mode and standby mode depending on the driving status of the DDI. Thus, in such an approach, the increased clock frequency provided by the DLL is only employed in situations where it is beneficial to do so.

An example way to control driving status of the DLL circuit block for use with DDI is presented below with reference to FIGS. 1 and 2.

Figure 1:
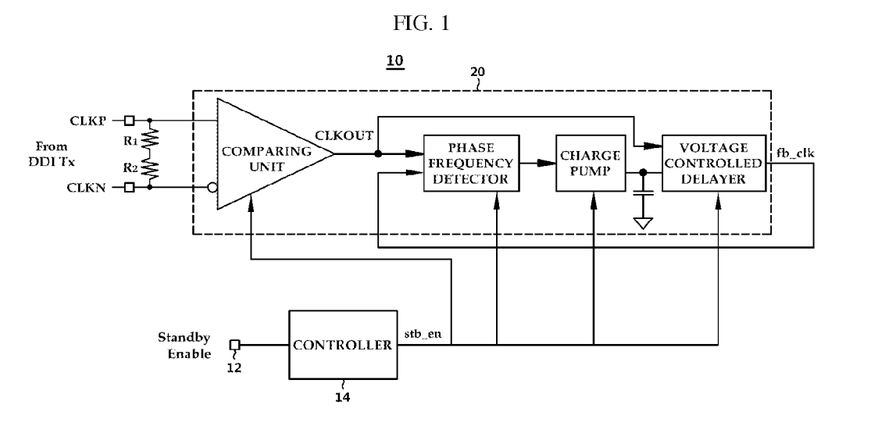
FIG. 1 is a circuit diagram illustrating switching a DLL circuit block to standby mode by externally applying a standby enable signal.

FIG. 1 illustrates an example of a circuit where an external signal is used. The control circuit 10 illustrated in FIG. 1 is configured to switch a DLL circuit block 20 to standby mode by externally applying a standby enable signal to the DLL circuit block 20.

To that purpose, the DLL circuit block 20 includes a controller 14 that applies a standby enable (stb_en) signal to the DLL circuit block 20 upon activation of an enable signal apply pin 12 communicatively connected to the controller 14.

In one example, the standby enable signal apply pin 12 is implemented as a button or a switch. The DLL circuit block 20 also includes a comparing unit which receives CLKP and CLKN signals, a phase frequency detector, a charge pump and a voltage controlled delayer.

As explained above, the approach illustrated in FIG. 1 enables a user to switch a driving mode of the DLL circuit block 20 as intended, because the user is able to put the DLL circuit block 20 into standby mode by activating the standby enable signal apply pin 12.

However, the approach of FIG. 1 using standby enable signal apply pin 12 leads to increased cost due to its requirement for the standby enable signal apply pin 12 and related circuits. Furthermore, since the user himself or herself directly activates the standby enable signal apply pin 12, precise timing on the user's part is required when switching from normal to standby mode. When the standby enable signal is applied too slowly when switching to standby mode, unnecessary power consumption occurs. Further, a user may arbitrarily apply a standby enable signal during operation in normal mode. In such a case, the DLL circuit block 20 does not operate normally because the standby enable signal forces it into standby mode, even when operating in such a mode is not appropriate or beneficial.

Another example of a method for controlling driving status of the DLL circuit block operates by detecting an operational status of CLKP/N, which is the output value of the DDI. Such an approach is presented below with reference to FIG. 2.

Figure 2:
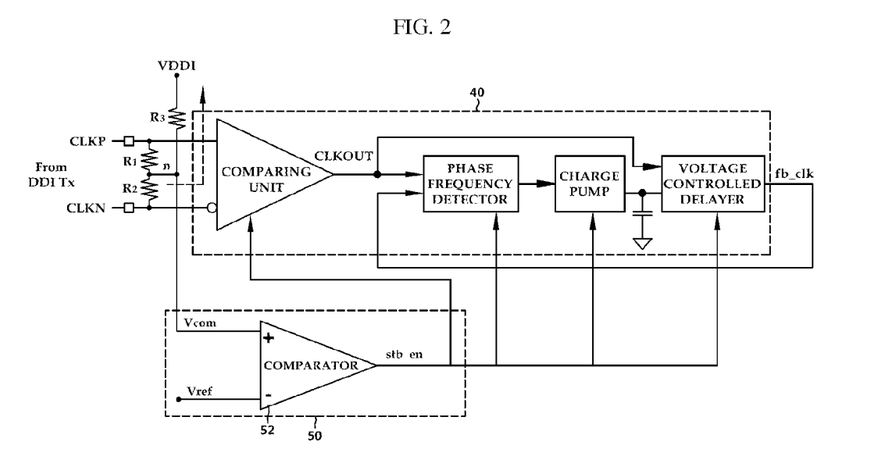
FIG. 2 is a circuit diagram illustrating controlling on driving status of a DLL circuit block by detecting a DDI output value, i.e., by detecting operational status of CLKP/N.

FIG. 2 illustrates a DLL circuit block 40 to which the CLKP/N signal, which is the output value from the DDI, is inputted.

A level detecting unit 50 is connected to an input end of the DLL circuit block 40. In the example of FIG. 2, the level detecting unit 50 is connected to a common terminal (n) to which the CLKP/N signal is applied.

The level detecting unit 50 includes a comparator 52.

The comparator 52 is configured so that a pull-up resistor (R3) and an internal voltage (VDDI) terminal are connected to a non-inverting terminal (+) of the comparator 52, and a reference voltage (Vref) is applied to an inverting terminal (−) of the comparator 52.

The comparator 52 outputs a standby enable signal (stb_en) only when the common terminal voltage (Vcom) received at the non-inverting terminal (+) exceeds the reference voltage (Vref). That is, because the non-inverting terminal (+) acquires a pull-up state by the internal voltage (VDDI) when the CLKP/N signal reaches a high impedance state, the common terminal voltage (Vcom) exceeds the reference voltage (Vref) in such a situation.

As explained above, FIG. 2 illustrates an example where the DLL circuit block 40 is automatically switched to standby mode as a result of detecting that the CLKP/N signal is in a high impedance state, without an external signal to invoke the switching process.

However, a circuit construction such as the one illustrated in FIG. 2 continues to have shortcomings. These shortcomings are explained below with reference to FIGS. 3A and 3B.

Figure 3A:
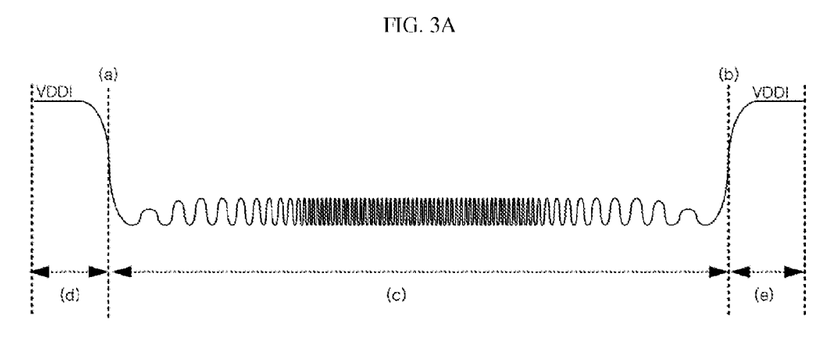
FIG. 3A illustrates standby mode interval and normal mode interval of the circuit in FIG. 2.
Figure 3B:
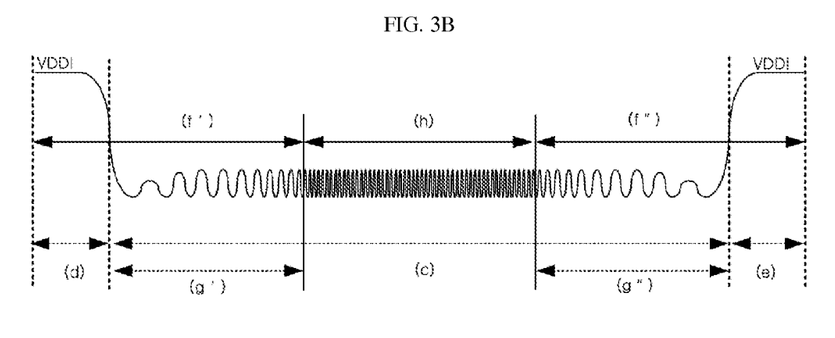
FIG. 3B illustrates operating areas of the standby mode and normal operation mode of the circuit in FIG. 2.

FIG. 3A illustrates a standby mode interval and a normal mode interval of the circuit illustrated in FIG. 2, and FIG. 3B illustrates operation areas of the standby mode and normal operation mode of the circuit illustrated in FIG. 2.

Referring to FIG. 3A, the normal mode interval (c) spans from time point (a) at which the output from the DDI, that is, the CLKP/N signal, changes from the high impedance state until time point (b) at which the CLKP/N signal changes back to high impedance state, and the rest intervals (d and e) are the standby mode intervals. Thus, the normal mode interval (c) corresponds to when the common terminal voltage (Vcom) is smaller than the reference voltage (Vref) so that the DLL circuit block is in its normal operation range.

However, transitioning between standby and normal mode requires time. For example, a predetermined time is required for the clock circuit of the DDI associated with a DLL as illustrated in FIG. 2 to reach a normal frequency during switching from standby mode to normal mode, such as from (d) to (c), or switching from normal mode to standby mode, such as from (c) to (e).

Thus, based on the transition time issue discussed above, there is an interval spanning the mode switching time. In such an interval, the DLL circuit block 40 cannot operate normally, because during the transition time it is not actually in a normal operational mode. That is, the DLL circuit block 40 also has to be switched to standby mode when the clock frequency of CLKP/N is smaller than the normal operation frequency of the DLL circuit block, so that the DLL circuit block is not relied upon for normal operation when it is in a transition between normal and standby mode.

However, since the approach of FIG. 2 is limited only to an occasion when the common terminal voltage (Vcom) is larger than the reference voltage (Vref), in practice, there is a low frequency domain in the normal mode interval where the DLL circuit block 40 cannot operate normally.

FIG. 3B illustrates the frequency domains (f' and f") where the DLL circuit block cannot operate. In these frequency domains (f' and f") the DLL circuit block is also under transition. Referring to FIG. 3B, although included in the normal mode interval (c), the intervals (g' and g") corresponding to frequency domains (f' and f") are intervals when the DLL circuit block 40 can malfunction.

That is, referring to FIG. 2, although the DLL circuit block 40 has the normal mode interval (c), due to frequency domains (f' and f") where the DLL circuit block 40 cannot operate normally due to being in transition, the normal mode interval (c) also includes the intervals (g' and g") where the DLL circuit block cannot operate normally.

Hence, FIG. 2 also illustrates the issue in which the DLL circuit block 40, which is designed to operate on standby mode in certain intervals, cannot easily switch to standby mode due to the presence of inoperable frequency domains, as explained above.

Accordingly, the related circuit configuration of FIG. 2 has the problem of unstable operation of a DLL circuit block.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various examples provide certain effects. For example, some examples help prevent malfunctioning intervals of a DLL circuit block when the DLL circuit block operates in a normal operation mode. Also, some examples quickly switch a DLL circuit block to standby mode according to an output value provided by the DDI.

In one general aspect, a delay-locked loop (DLL) operation mode control circuit includes a first comparing unit configured to compare a clock frequency of a display driver IC (DDI) with a reference frequency, a second comparing unit configured to compare a common terminal voltage of the DDI with a reference voltage, and a logic gate configured to output a standby enable signal used to switch a DLL circuit to standby mode, in response to a standby mode switch signal being applied from at least one of the first and second comparing units.

The DLL circuit may include a comparing unit, a phase frequency detector, a charge pump, and a voltage control delay line (VCDL).

The standby mode switch signal may be applied to each one of the comparing unit, a phase frequency detector, a charge pump, and the voltage control delay line.

The DLL circuit may be configured to receive clock frequency CLKP and CLKN signals of the DDI at the comparing unit.

The first comparing unit may include a first comparator configured to receive clock frequency CLKP and CLKN signals of the DDI, a low-pass filter configured to filter an original output frequency from the first comparator, and a controller configured to receive the original output frequency and an output frequency passed through the low-pass filter, and compare the number of rising edges of the original output frequency and the output frequency passed through the low-pass filter to generate the standby mode switch signal.

The output frequency from the first comparator may represent a relationship between CLKP and CLKN.

The standby mode switch signal may be generated when the numbers of rising edges of the output frequencies are equal.

The low-pass filter may be configured to be associated with a frequency that is greater than or equal to a minimum normally operable frequency of the DLL circuit.

The first comparing unit may generate the standby mode switch signal, in response to the clock frequency of the DDI being smaller than a normal operation frequency of the DLL circuit.

The logic gate may be an OR gate.

One terminal of the OR gate may be connected to the first comparing unit and another terminal of the OR gate may be connected to the second comparing unit.

The second comparing unit may generate the standby mode switch signal, in response to the common terminal voltage being greater than the reference voltage.

The second comparing unit may include a second comparator including a non-inverting terminal (+) connected to a pull-up resistor and an internal voltage terminal to receive a common terminal voltage of clock frequency signals CLKP and CLKN, and an inverting terminal (−) to receive a preset reference voltage, and the second comparator may generate the standby mode switch signal, in response to the common terminal voltage being greater than the reference voltage.

In another general aspect, a delay-locked loop (DLL) operation mode control method includes detecting, at a DLL operation mode control circuit, an operational status or a clock frequency of a display driver IC (DDI), generating a standby mode switch signal in response to the operational status indicating abnormal operation or in response to the clock frequency being smaller than a preset DLL normal operation frequency, and placing a DLL circuit into standby according to the standby mode switch signal.

The standby mode switch signal may be generated according to the operational status, when clock frequency signals CLKP and CLKN of the DDI have high impedance (Hi-z) state.

The standby mode switch signal may be generated as a first signal by a frequency comparing unit or as a second signal by a level comparing unit based on at least one of the operational status and the clock frequency.

The DLL operation mode control circuit, configured as explained above according to various examples, provides the following effects.

First, in some examples, it is possible to place the DLL circuit into standby mode by detecting an operational mode of the DDI, based on the operational status and frequency of a clock signal of the DDI, without requiring an external signal to switch the mode into standby mode.

Additionally, in some examples, the DLL operation disabled interval, can be included in the standby mode. The DLL operation disabled interval refers to the interval which is ordinarily included in the normal mode interval during switching from standby mode to normal mode or switching from normal mode to standby mode. As a result, because malfunction of the DLL circuit in the normal mode interval is prevented, a DLL circuit can operate stably in a region where the DDI clock signal cannot operate otherwise.

Further, since the DLL operation disabled interval is included in the standby mode, power consumption due to DLL operation can also be minimized because the DLL does not draw power corresponding to normal mode during the DLL operation disabled interval.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the description of the examples, a DLL operation mode control circuit includes a display driver IC (DDI) and a DLL circuit block is connected to an output of the DDI. However, the examples are not limited to any specific approaches, but include any appropriate circuit architectures for DLL circuit blocks.

As discussed herein, a DDI is the IC that drives a display panel. A DDI provides the display panel with a driving signal that includes data about what the display panel is to display, so that text and/or images are displayed on screen on the display panel, based on the driving signal. In various examples, the DDI includes one or more of a source driver IC, a gate driver IC, a graphic RAM, and a power generation circuit.

Various products may be equipped with such a DDI, and may include mobile devices such as a smart phone, or other devices such as a TV. Accordingly, when such a product, equipped with a DDI requires low power consumption, it turns to standby mode. To facilitate low power consumption, examples detect the standby state and rapidly switch the DLL circuit block to standby mode so that its power requirements are reduced. Examples also rapidly detect the operational status and frequency of CLKP/N, which is the signal output from the DDI, and switch the DLL circuit block operating in normal mode to standby mode. The examples discussed herein relate to approaches for achieving such technical effects.

For example, an example achieves a fast interface having different input pairing with the output from the DDI, that is, the CLKP/N output. For example, an example is applicable to Low-voltage differential signaling (LVDS), Sub-low-voltage differential signaling (Sub-LVDS), Multipoint LVDS (mLVDS), or AiPi.

A DLL operation mode control circuit according to an example is explained with reference to the drawings.

Figure 4:
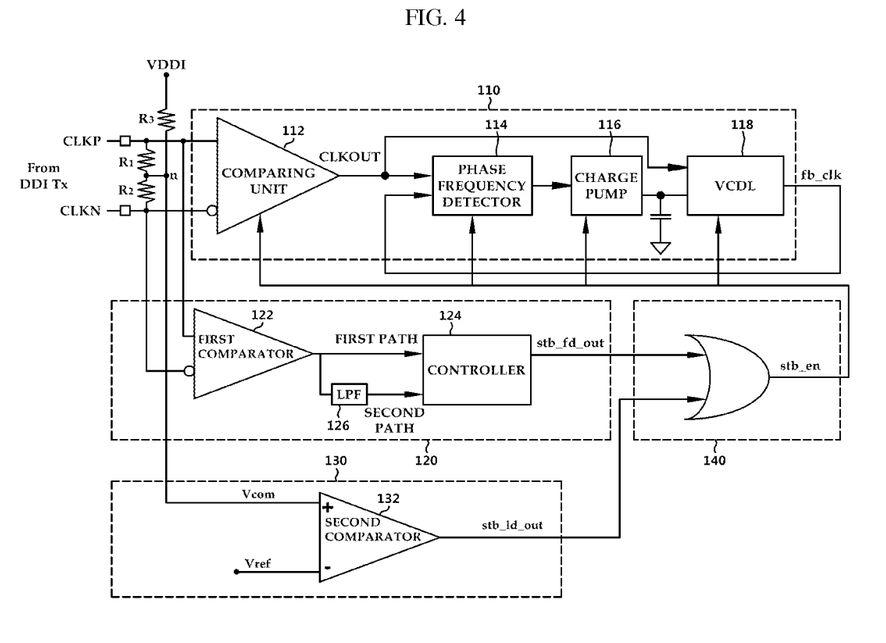
FIG. 4 illustrates a DLL operation mode control circuit, according to an example.

FIG. 4 illustrates a DLL operation mode control circuit according to an example. The DLL operation mode control circuit is referred to simply as "control circuit."

The control circuit 100 includes a DLL block 110 connected to an output of a DDI block (not illustrated). FIG. 4 shows the parts of the DLL block 110 that receive information from the output, labeled as being "From DDI Tx".

The DLL block 110 includes a comparing unit 112 which receives CLKP and CLKN signals that are the output values from the DDI. The comparing unit 112 receives the CLKP signal through a non-inverting terminal (+) and receives the CLKN signal through an inverting terminal (−). Terminal load resistors (R1, R2) are connected between the non-inverting terminal (+) and the inverting terminal (−).

A phase frequency detector (PFD) 114 is connected to the output end of the comparing unit 112, to receive an output signal (clkout) from the comparing unit 112 and feed back an internal clock signal (fb_clk) and to compare a phase difference of the clkout and fb_clk signals. The output signal from the phase frequency detector 114 is a rising edge pulse signal or a falling edge pulse signal.

A charge pump (CP) 116 receives the output signal from the PFD 114. The CP 116 converts the output signal from the PFD 114 into a voltage signal and outputs a control signal (vctrl, not shown) to vary the delay time for a predetermined interval. The output of the CP 116 is connected to a voltage controlled delay line (VCDL) 118. The VCDL 118 adjusts an output signal for the predetermined delay time and outputs an internal clock signal (fb_clk). The internal clock signal (fb_clk) is fed back to the PFD 114.

The DLL block with the architecture discussed above increases an operational speed of the DDI connected to the DDI and the product equipped with the DDI.

Meanwhile, as explained above, the DLL block 110 operates in normal mode or standby mode depending on the operational mode of the DDI block 110. Accordingly, examples are able to rapidly detect the operational mode of the DDI block 110 and switch the DLL block 110 to a corresponding operational mode.

In one example, a comparing block is provided to detect the operational mode of the DDI block. As illustrated, the comparing block includes a frequency comparing unit 120, a level comparing unit 130, and a logic gate 140.

The frequency comparing unit 120 includes a frequency detecting comparator, first comparator 122. First comparator 122 is connected to the DDI output to detect the CLKP/N clock frequency. The output signal from the first comparator 122 is a determination of whether the CLKP/N clock frequency is a high frequency or a low frequency signal. In an example, the CLKP/N clock frequency is compared to a threshold to decide whether it is a high frequency signal or a low frequency signal.

A controller 124 is connected to the first comparator 122. In one example, the controller 124 directly receives the output frequency of the first comparator 122 via a first transmission path. In another example, the controller 124 receives the output frequency after filtering at a low-pass filter (LPF) 126 provided as part of a second transmission path. The LPF 126 is configured to have a frequency greater than or equal to the minimum operable frequency of the DLL block 110. Hence, the LPF 126 is configured to attenuate signals associated with a greater frequency than the frequency associated with the LPF. The controller 124 generates a first signal (stb_fd_out) to standby the DLL block 110. The first signal is transmitted to a first input terminal of the logic gate 140.

As explained above, the frequency comparing unit 120 compares the CLKP/N frequency with the frequency requirements for normally operating the DLL block 110.

The level comparing unit 130 includes one level detecting comparator, second comparator 132.

In the second comparator 132, the non-inverting terminal (+) is connected to a pull-up resistor (R3) and internal voltage VDDI terminal is connected between the terminal load resistors (R1 and R2), to receive common terminal voltage (Vcom) of CLKP/N. The inverting terminal (−) of the second comparator 132 receives a reference voltage (Vref). The second comparator 132 generates a second signal (stb_ld_out) to place the DLL block 110 into standby mode only when the common terminal voltage (Vcom) is greater than the reference voltage (Vref). The second signal is transmitted via the second input terminal of the logic gate 140.

Thus, the level comparing unit 130 detects a CLKP/N clock signal that is in a high impedance (Hi-z) state.

The logic gate 140 receives a first signal (stb_fd_out) from the frequency comparing unit 120 and a second signal (stb_ld_out) from the level comparing unit 130 via its first and second input terminals, and generates a standby enable signal (stb_en) to place the DLL block 110 into standby mode. The standby enable signal (stb_en) has a high level value, and it is transmitted to the DLL block 110 when any one of the first and second signals (stb_fd_out, stb_ld_out) is applied. In one example, the logic gate 140 is an OR gate. However, any architecture is implementable, as long as it can generate the standby enable signal (stb_en) in accordance with the first and second signals (stb_fd_out, stb_ld_out).

The operation of the DLL operation mode control circuit constructed as explained above is explained below.

Figure 5:
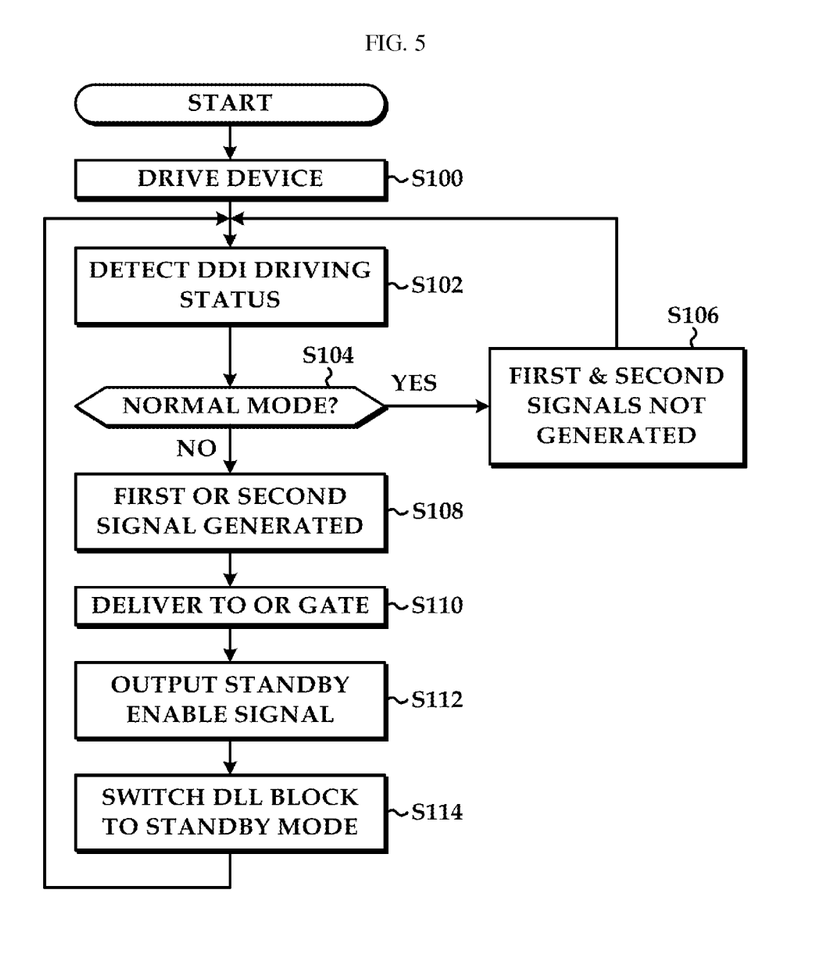
FIG. 5 is a flowchart illustrating an operation of switching a DLL block to a standby mode, according to an example.

FIG. 5 is a flowchart provided to explain the operation of switching the DLL block to standby mode according to an example.

At S100, the method drives a DDI device. For example, a series of devices equipped with DDI and DLL block 110 begin to be driven by the DLL block 110.

At S100, the devices operate in normal mode. That is, the CLKP/N frequency is within the DLL operating frequency range, and the CLKP/N common terminal voltage (Vcom) is smaller than the reference voltage (Vref).

At S102, the method detects a DDI driving status. For example, the frequency comparing unit 120 and the level comparing unit 130 in normal mode continuously detect the driving status of the DDI.

At S104, the method determines whether or not the DDI is operating in normal mode. For example, depending on the detecting operation, the normal mode condition is perceived at S104, in response to the CLKP/N frequency being within DLL operating frequency range and in response to the CLKP/N common terminal voltage (Vcom) staying smaller than the reference voltage (Vref).

At S106, the method does not generate first and second signals. Accordingly, at S106, the DDI is operating in normal mode and the first and second signals (stb_fd_out, stb_ld_out) are not generated.

However, when the frequency comparing unit 120 compares and detects CLKP/N frequency as deviating from the DLL operating frequency range, or when the level comparing unit 130 compares and detects CLKP/N common terminal voltage (Vcom) as exceeding the reference voltage (Vref), the condition is perceived as requiring a standby condition.

At S108, the method generates a first or second signal. For example, at S108, the frequency comparing unit 120 generates a first signal (stb_fd_out) or the level comparing unit 130 generates a second signal (stb_ld_out).

At S110, the method delivers the first or second signal to an OR gate. For example, at S110, at least one of the first and second signals (stb_fd_out, stb_ld_out) is transmitted to the OR gate 140.

At S112, the method outputs a standby enable signal. For example, the OR gate 140 generates a standby enable signal (stb_en), when one of the first and second signals (stb_fd_out, stb_ld_out) is inputted.

At S114, the method switches the DLL block to standby mode. For example, at S114, the DLL block 110 is switched to standby mode.

Following S114, when the device does not stop driving, the frequency comparing unit 120 and the level comparing unit 130 repeat detecting driving status of the DDI at S102.

Figure 6A:
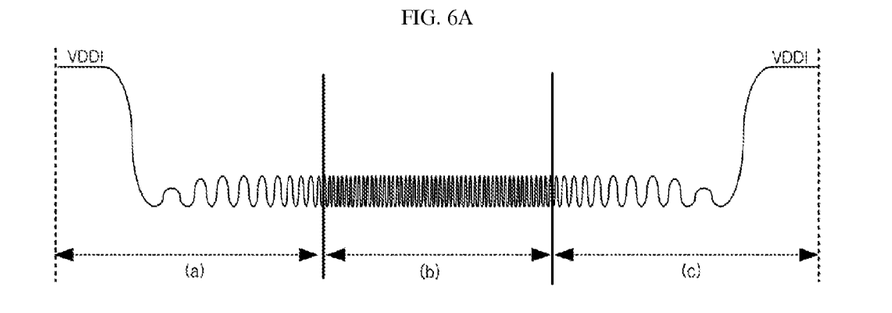
FIG. 6A illustrates standby mode interval and normal mode interval, according to an example.
Figure 6B:
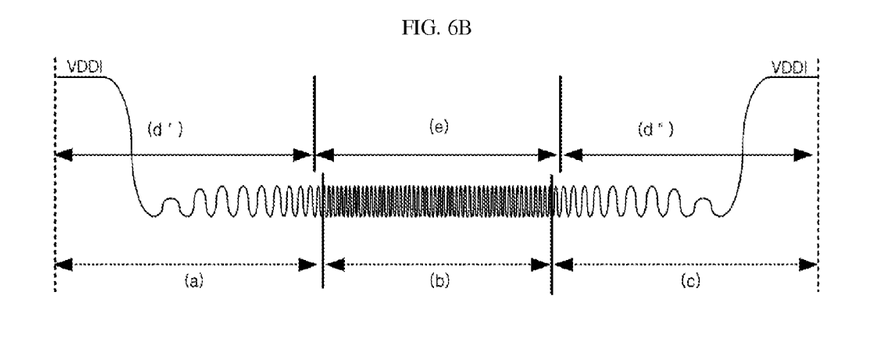
FIG. 6B illustrates operating areas of the standby mode and normal mode, according to an example.

As explained above, either the frequency comparing unit 120 and the level comparing unit 130 detects the DDI driving mode and standbys the DLL block 110. As a result, an inoperable frequency domain, which is existent in a certain interval of the normal mode interval of the conventional DLL block 110, is removed. This is explained further below with reference to FIG. 6.

FIG. 6A illustrates standby mode interval and normal mode interval according to an example, and FIG. 6B illustrates the operating areas of the standby mode and normal mode according to an example.

Referring to FIG. 6A, the standby mode interval (a) ends and the normal operation mode interval (b) begins at a time point when CLKP/N changes from a high impedance state or when DLL block 110 enters minimum operable frequency range.

Likewise, the normal operation mode interval (b) ends and the standby mode interval (c) begins when CLKP/N changes into a high impedance state or when DLL block exits out of the minimum operable frequency range.

Referring to FIG. 6A, it shows that the inoperable frequency domains (d' and d") of the DLL block 110 can be switched to corresponding to standby mode intervals (a and c).

In other words, in the example of FIG. 6A, the frequency domain at which the DLL block 110 is not able to operate, is included in the standby mode intervals (a and c). Accordingly, since the interval in which the DLL block 110 cannot normally operate is excluded and switched to the standby mode intervals (a and c), the malfunctioning of the DLL block 110 is prevented.

An analogous discussion applies to when the operation switches from the normal mode to standby mode. For example, while the frequency domain at which the DLL block is not able to operate is included in the standby mode in other approaches, such frequency domain is included in the standby mode interval, in the example.

The result of simulation according to an example is explained below, separately referring to the frequency comparing unit 120 and the level comparing unit 130 that place the DLL block in standby mode.

First, the result of simulation of the frequency comparing unit 120 is explained.

Figure 7:
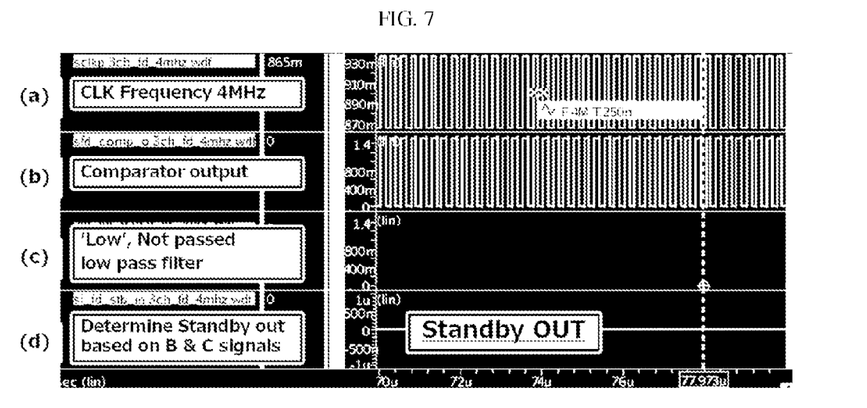
FIG. 7 illustrates results of simulating switching a frequency detecting unit to a normal mode, according to an example.

FIG. 7 is a result of simulation that the frequency comparing unit is switched to normal mode, according to an example.

The normal mode occurs when the CLKP/N frequency is within the DLL operating frequency range. For example, it is assumed that the CLKP/N frequency is within 4 MHz, that is, the normal operation frequency of the DLL block 110.

When CLKP/N frequency is applied at 4 MHz, see FIG. 7A, the first comparator 122 delivers the output frequency outputted on the first path to the controller 124, see FIG. 7B. The output frequency delivered through the second path to the controller 124 has a low value, see FIG. 7C. The low value at FIG. 7C occurs because the output frequency of the first comparator 122 cannot pass the low-pass filter 126 on the second path.

The controller 124 compares the output frequencies delivered along the first and second paths. In an example, for the comparison of the output frequencies, the number of rising edges or falling edges of the output frequencies delivered through the first and second paths is compared.

When the numbers, such as of rising edges and falling edges, differ as a result of the comparison, the controller 124 outputs a first signal (stb_fd_out) to switch to the normal operation mode to the OR gate 140, and the OR gate 140 outputs a standby enable signal (stb_en) of low level value, as illustrated in FIG. 7D.

Accordingly, the DLL block 110 is switched from the standby mode to normal operation mode, as portrayed in FIG. 7.

Figure 8:
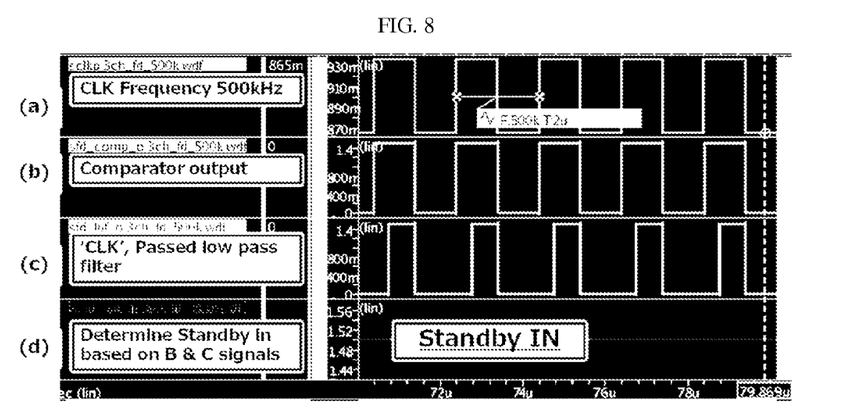
FIG. 8 illustrates results of simulating switching a frequency detecting unit to standby mode, according to an example.

FIG. 8 is a result of simulation of the frequency comparing unit switching into standby mode, according to an example.

The standby mode occurs when the CLKP/N frequency deviates from the operating frequency of the DLL block 110. For example, it is assumed that CLKP/N frequency is 500 kHz.

Referring to FIG. 8A, CLKP/N frequency of 500 kHz is delivered to the first comparator 122.

The first comparator 122 receives the output frequency of FIG. 8B from the first path, and receives the output frequency of FIG. 8C from the second path. The output frequency of FIG. 8C is the frequency that passes the low-pass filter 126. The output frequencies of FIGS. 8B and 8C are delivered to the controller 124.

The controller 124 compares the output frequencies delivered through the first and second paths. For the comparison of the output frequencies, the number of rising edges or falling edges of the output frequencies delivered through the first and second paths is compared. When the numbers match as a result of the comparison, the controller 124 outputs a signal to switch to the standby mode to the OR gate 140.

The OR gate 140 then outputs a standby enable signal (stb_en) of high level value, see FIG. 8D, and the DLL block 110 is switched from the normal mode to the standby mode.

Figure 9:
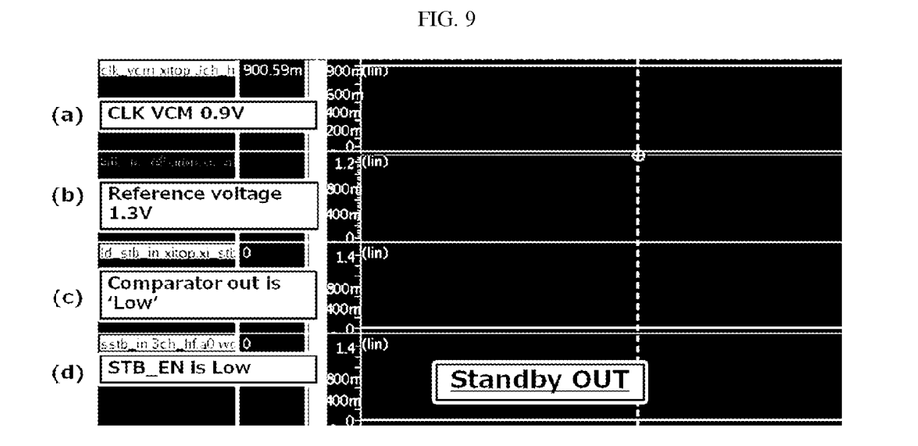
FIG. 9 illustrates results of simulating switching a level detecting unit to normal mode, according to an example.
Figure 10:
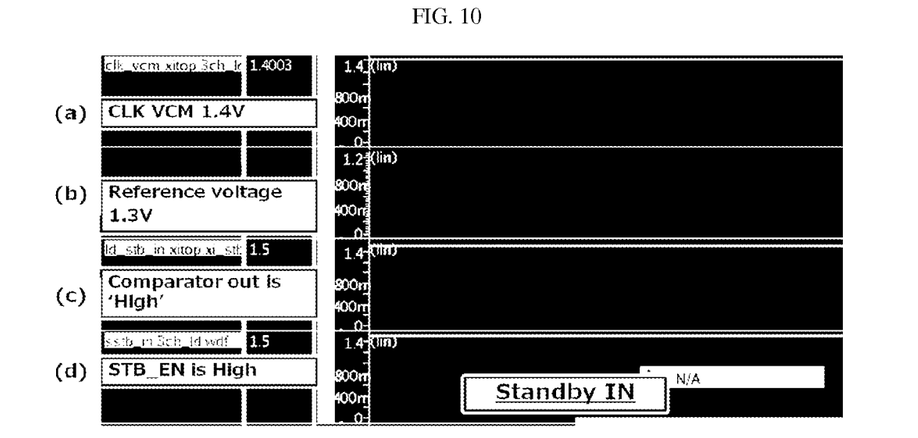
FIG. 10 illustrates result of simulating switching a level detecting unit to standby mode, according to an example.

The results of simulation of the level comparing unit are explained below.

FIG. 9 is a result of simulation of a level comparing unit switching to normal mode, according to an example.

Referring to FIG. 9A, a common terminal voltage (Vcom), for example, 0.9V, is applied to the non-inverting terminal (+) of the second comparator 132.

Referring to FIG. 9B, the reference voltage (Vref), for example, 1.3V, is applied to the inverting terminal (−) of the second comparator 132.

The second comparator 132 compares the voltages of FIGS. 9A and 9B, and outputs an output signal (FIG. 9C) that has a low level according to the result of a comparison that indicates a lower common terminal voltage (Vcom) than the reference voltage (Vref).

The OR gate 140 outputs a standby enable signal (stb_en) (FIG. 9D) of low level value and accordingly, the DLL block operates in normal operation mode.

FIG. 10 is a result of simulation of the level comparing unit switching to standby mode, according to an example.

Referring to FIG. 10A, a common terminal voltage (Vcom), for example, 1.4V, is applied to the non-inverting terminal (+) of the second comparator 132.

Referring to FIG. 10B, reference voltage (Vref), for example, 1.3V, is applied to the inverting terminal (−) of the second comparator 132.

The second comparator 132 compares the voltages of FIGS. 10A and 10B, and outputs an output signal (FIG. 10C) of high level according to the result of comparison that indicates higher common terminal voltage (Vcom) than the reference voltage (Vref).

Based on the comparison, the OR gate 140 outputs a standby enable signal (stb_en) (FIG. 10D) of high level value. Hence, the DLL block 110 is switched to standby mode.

As explained above, one of the output values of the DDI, such as CLKP/N frequency and CLKP/N common terminal voltage is detected, to switch the DLL block to standby mode. As a result, since the inoperable frequency domain that is present in the normal mode interval of the DLL block is included in the standby mode, malfunctioning of the DLL circuit can be prevented.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A delay-locked loop (DLL) operation mode control circuit, comprising:
a first comparing unit configured to compare a clock frequency of a display driver IC (DDI) with a reference frequency;
a second comparing unit configured to compare a common terminal voltage of the DDI with a reference voltage; and
a logic gate configured to output a standby enable signal used to switch a DLL circuit to standby mode, in response to a standby mode switch signal being applied from at least one of the first and second comparing units.

2. The DLL operation mode control circuit of claim 1, wherein the DLL circuit comprises a comparing unit, a phase frequency detector, a charge pump, and a voltage control delay line (VCDL).

3. The DLL operation mode control circuit of claim 2, wherein the standby mode switch signal is applied to each one of the comparing unit, a phase frequency detector, a charge pump, and the voltage control delay line.

4. The DLL operation mode control circuit of claim 2, wherein the DLL circuit is configured to receive clock frequency CLKP and CLKN signals of the DDI at the comparing unit.

5. The DLL operation mode control circuit of claim 1, wherein the first comparing unit comprises:
- a first comparator configured to receive clock frequency CLKP and CLKN signals of the DDI;
- a low-pass filter configured to filter an original output frequency from the first comparator; and
- a controller configured to receive the original output frequency and an output frequency passed through the low-pass filter, and compare the number of rising edges of the original output frequency and the output frequency passed through the low-pass filter to generate the standby mode switch signal.

6. The DLL operation mode control circuit of claim 5, wherein the output frequency from the first comparator represents a relationship between CLKP and CLKN.

7. The DLL operation mode control circuit of claim 5, wherein the standby mode switch signal is generated when the numbers of rising edges of the output frequencies are equal.

8. The DLL operation mode control circuit of claim 5, wherein the low-pass filter is configured to be associated with a frequency that is greater than or equal to a minimum normally operable frequency of the DLL circuit.

9. The DLL operation mode control circuit of claim 1, wherein the first comparing unit generates the standby mode switch signal, in response to the clock frequency of the DDI being smaller than a normal operation frequency of the DLL circuit.

10. The DLL operation mode control circuit of claim 1, wherein the logic gate is an OR gate.

11. The DLL operation mode control circuit of claim 10, wherein one terminal of the OR gate is connected to the first comparing unit and another terminal of the OR gate is connected to the second comparing unit.

12. The DLL operation mode control circuit of claim 1, wherein the second comparing unit generates the standby mode switch signal, in response to the common terminal voltage being greater than the reference voltage.

13. The DLL operation mode control circuit of claim 1, wherein the second comparing unit comprises a second comparator comprising a non-inverting terminal (+) connected to a pull-up resistor and an internal voltage terminal to receive a common terminal voltage of clock frequency signals CLKP and CLKN, and an inverting terminal (−) to receive a preset reference voltage, and
the second comparator generates the standby mode switch signal, in response to the common terminal voltage being greater than the reference voltage.

14. A delay-locked loop (DLL) operation mode control method, comprising:
- detecting, at a DLL operation mode control circuit, an operational status or a clock frequency of a display driver IC (DDI);
- generating a standby mode switch signal in response to the operational status indicating abnormal operation or in response to the clock frequency being smaller than a preset DLL normal operation frequency; and
- placing a DLL circuit into standby according to the standby mode switch signal.

15. The DLL operation mode control method of claim 14, wherein the standby mode switch signal is generated according to the operational status, when clock frequency signals CLKP and CLKN of the DDI have high impedance (Hi-z) state.

16. The DLL operation mode control method of claim 14, wherein the standby mode switch signal is generated as a first signal by a frequency comparing unit or as a second signal by a level comparing unit based on at least one of the operational status and the clock frequency.

* * * * *